(12) United States Patent
Poletto et al.

(10) Patent No.: US 11,150,279 B2
(45) Date of Patent: Oct. 19, 2021

(54) DEVICE FOR MEASURING THE CURRENT FLOWING IN AN INDUCTIVE LOAD

(71) Applicant: STMICROELECTRONICS S.R.L., Agrate Brianza (IT)

(72) Inventors: Vanni Poletto, Casale Monferrato (IT); Riccardo Miglierina, Borgarello (IT); Antonio Davide Leone, Pieve Emanuele (IT); Sergio Lecce, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 68 days.

(21) Appl. No.: 16/554,248

(22) Filed: Aug. 28, 2019

(65) Prior Publication Data
US 2019/0383861 A1 Dec. 19, 2019

Related U.S. Application Data

(63) Continuation of application No. 16/262,521, filed on Jan. 30, 2019, now Pat. No. 10,444,264, which is a continuation of application No. 15/372,127, filed on Dec. 7, 2016, now Pat. No. 10,215,782.

(30) Foreign Application Priority Data

May 6, 2016 (IT) .................. 102016000046813

(51) Int. Cl.
*G01R 31/34* (2020.01)
*G01R 19/165* (2006.01)
*G11C 27/02* (2006.01)
*H03F 3/45* (2006.01)

(52) U.S. Cl.
CPC ....... *G01R 19/1659* (2013.01); *G01R 31/343* (2013.01); *G11C 27/02* (2013.01); *H03F 3/45179* (2013.01); *H03F 2200/462* (2013.01)

(58) Field of Classification Search
CPC ... G01R 1/203; G01R 15/146; G01R 19/0007
See application file for complete search history.

(56) References Cited

U.S. PATENT DOCUMENTS

| | | | |
|---|---|---|---|
| 5,180,927 A | 1/1993 | Poletto | |
| 5,763,963 A | 6/1998 | Zydek et al. | |
| 6,304,108 B1 | 10/2001 | Inn | |
| 6,377,109 B1 | 4/2002 | Yama | |
| 8,704,508 B2 | 4/2014 | Fey et al. | |
| 2003/0006749 A1 | 1/2003 | Rollman | |
| 2005/0040835 A1* | 2/2005 | Loucks | G01R 27/205 324/713 |

(Continued)

*Primary Examiner* — Tung X Nguyen
(74) *Attorney, Agent, or Firm* — Seed IP Law Group LLP

(57) ABSTRACT

A circuit includes a switching circuit including a first switch and a second switch. A current sensing circuit is coupled to the switching circuit to sense a first current through the first switch and to generate a first sensed current signal based on the sensed first current, and configured to sense a second current through the second switch and to generate a second sensed current signal based on the sensed second current. An output circuit is coupled to the current sensing circuit and is configured to generate a failure signal based on the first sensed current signal and the second sensed current signal.

20 Claims, 13 Drawing Sheets

(56) References Cited

U.S. PATENT DOCUMENTS

| | | | | |
|---|---|---|---|---|
| 2008/0238469 | A1* | 10/2008 | Ikeda | G01R 31/31712 |
| | | | | 324/762.01 |
| 2012/0293156 | A1 | 11/2012 | Galbis et al. | |
| 2015/0048770 | A1* | 2/2015 | Lokere | G01R 19/0092 |
| | | | | 318/504 |
| 2015/0303805 | A1 | 10/2015 | Franchini et al. | |

* cited by examiner

DEVICE FOR MEASURING THE CURRENT FLOWING IN AN INDUCTIVE LOAD

BACKGROUND

Technical Field

The present description relates to the technical problem of the measurement of current that flows in an inductive load.

One or more embodiments may find application in the automotive field where a high level of integrity of safety is required.

Description of the Related Art

The fundamental characteristics of devices for measuring current in inductive loads are the following:
  regulation of current is carried out with the pulse-width-modulation (PWM) method, where the driver periodically connects at least one of the two terminals of the inductive load to the positive supply and the negative supply, at a pre-set frequency;
  when just one of the two terminals of the load is driven in PWM while the other remains constantly connected to one of the two supplies, positive or negative, the current in the inductive load flows in a unidirectional way; this is typically the case of a solenoid for automotive applications that regulates the pressure of a fluid (oil) with the purpose of actuating various mechanisms, such as:
    control of the braking system with ABS/ESP function; and
    control of the automatic or servo-assisted change (transmission control);
  when both sides of the load are driven in PWM the current in the inductive load can flow in both directions; this is typically the case of the winding of an electric motor, because the latter must be able to turn in both directions;
  the current in the inductive load can assume, during operation, values regulated with continuity from a minimum value, close to zero, up to a maximum value specified during design of the system; and
  the device for measuring the current respects the most stringent standards (ASIL-D) as regards functional safety (ISO-26262), ensuring identification of a single failure point wherever this may be located.

Normally, in the solutions currently in use, it is chosen to guarantee functional safety with two separate and independent current-measuring paths.

By comparing the results of the two measurements performed on the two different paths it is possible to evaluate whether:
  the two measurements differ for a value lower than a pre-set maximum error; if so, they are both judged correct, and the device for measuring the current is free from faults; and whether:
  the two measurements differ for a value higher than a pre-set maximum error; if so, one of the two measurements is not correct (even though it is not known which one is not correct), and the device for measuring the current presents a fault.

As is known, the measurements of current have a short propagation delay and a high frequency response in so far as they are set within a control loop.

Some known solutions will now be described with reference to FIGS. 1, 1a, 1b, 1c, 1d, and 2.

Illustrated in FIG. 1 is the operating principle of some known solutions. In particular, the device for measuring the current comprises a load driver device Load Driver and uses two separate current-measuring paths in order to detect the current $I_L$ that flows in the inductive load Inductive Load connected between two nodes D and Q. The node D is connected to the positive voltage $V_{POS}$.

The device comprises two N-channel MOSFETs, in particular a high-side power transistor HS and a low-side power transistor LS, cascaded together and connected between the node D and a node G. The node G is in turn connected to the negative voltage $V_{NEG}$.

Consequently, the device has a high side and a low side.

The source terminal of the MOSFET LS is connected to the node G, whereas the drain terminal of the MOSFET HS is connected to the node D. The intermediate point between the two MOSFETs is connected to the central node Q.

Flowing in the high-side MOSFET HS is the current $I_{L-HS}$, whereas flowing in the low-side MOSFET LS is the current $I_{L-LS}$.

Connected to the line that is connected to the node Q are two current-sense amplifiers $CSA_1$ and $CSA_2$, which sense the current $I_L$ that flows in the line (i.e., the same that flows in the inductive load).

In a comparison node, the two currents are added (the second with negative sign): the output of the comparison node generates the failure signal Fail.

In particular, the failure signal Fail notifies the case where the difference of the outputs of the amplifiers falls outside a predefined window.

In the timing chart of FIG. 1, there may be seen the plots of the currents $I_L$, $I_{L-HS}$, and $I_{L-LS}$, respectively, corresponding to the plot of the voltage $V_Q$ measured on the node Q.

Illustrated in FIG. 2 is an example of implementation of a known solution.

In particular, having two separate current-measuring paths requires duplication of the measurement resistors $R_{S1}$, $R_{S2}$. Consequently, with this implementation there will be further voltage drops on the duplicated measurement resistors $R_{S1}$, $R_{S2}$.

With reference to FIGS. 1a, 1b, 1c, and 1d, there will now be introduced the main limits of the known solutions.

For instance, the known solution illustrated in FIGS. 1a and 1b does not detect the errors due to the losses introduced by the shown leakage resistors $RH_{LEAK}$, $RL_{LEAK}$, the reason being that they do not cause any difference in the two current-measuring paths.

Instead, the known solution illustrated in FIG. 1c detects failure of the current-sense amplifiers (CSAs) because they cause different results in the two current-sensing paths.

The known solution makes it also possible to detect the losses due to the leakage resistors $RH_{LEAK}$ and $RL_{LEAK}$ as shown in FIG. 1d, because they cause different currents in the two current-sensing paths. However, they have a higher likelihood of occurrence of dispersion losses on the outer side of the inductive load (as illustrated in FIG. 1a).

The known solution illustrated in FIGS. 1 and 2 presents a drawback in terms of cost. In fact, doubling of the in-series resistances for current measurement leads to an increase (which is a degradation) of the total impedance seen between the pins of the integrated device. In particular, the path from the node D to the node Q is made up of $R_{S1}$, $R_{S2}$, and $R_{HS}$, whereas the path from the node Q to the node G is made up of $R_{S1}$, $R_{S2}$, and $R_{LS}$.

In order to keep the impedance of the two paths unaltered, it is necessary to oversize both of the power transistors HS and LS so as to reduce their impedance $R_{HS}$, and $R_{LS}$ by an amount equal to the added series resistance rendered redundant for the measurement of current.

The known solution is able to diagnose the presence of a fault only in the current-measuring components (FIGS. 1c and 1d). Instead, to diagnose faults in the power transistors HS and LS and in the load Inductive Load in the form of leakage resistances towards one of the supplies (FIGS. 1a and 1b), it is necessary to add purposely provided circuits.

BRIEF SUMMARY

According to one or more embodiments, a device for measuring the current that flows in an inductive load comprises a device for driving the inductive load and uses two separate current-measuring paths in order to detect the current that flows in the inductive load. The inductive load is connected between a first node and a second node, and the first node is connected to a first voltage. The device comprises a first transistor and a second transistor cascaded together and connected between the first node and a third node connected to a second voltage.

The device further comprises a first sense amplifier and a second sense amplifier for measuring the current that flows in the inductive load. The first sense amplifier is connected to at least one terminal of the first transistor, and the second sense amplifier is connected to at least one terminal of the second transistor. The measurement device comprises two blocks for sampling and holding the signals at output from the first and second sense amplifiers, which represent, respectively, the currents that flow in the aforesaid two separate current-measuring paths. The two currents are subtracted in a comparison node for generating an error signal, which is compared in a window comparator with a predefined window, and if the error signal assumes values outside the predefined window the device generates a failure signal.

In one embodiment, a circuit includes a switching circuit including a first switch and a second switch. A current sensing circuit is coupled to the switching circuit to sense a first current through the first switch and to generate a first sensed current signal based on the sensed first current, and configured to sense a second current through the second switch and to generate a second sensed current signal based on the sensed second current. An output circuit is coupled to the current sensing circuit and is configured to generate a failure signal based on the first sensed current signal and the second sensed current signal.

BRIEF DESCRIPTION OF THE SEVERAL VIEWS OF THE DRAWINGS

One or more embodiments will now be described, purely by way of example, with reference to the annexed drawings, wherein.

DETAILED DESCRIPTION

In the ensuing description, one or more specific details are illustrated in order to provide an in-depth understanding of the examples of the embodiments. The embodiments may be obtained without one or more of the specific details, or with other methods, components, materials, etc. In other cases, known operations, materials or structures are not illustrated or described in detail so that certain aspects of the embodiments will not be obscured.

Reference to "an embodiment" or "one embodiment" in the framework of the present description is intended to indicate that a particular configuration, structure, or characteristic described with reference to the embodiment is comprised in at least one embodiment. Hence, phrases such as "in an embodiment" or "in one embodiment" that may be present in one or more points of the present description do not necessarily refer precisely to one and the same embodiment. Furthermore, particular conformations, structures, or characteristics may be combined in any adequate way in one or more embodiments.

The references used herein are provided merely for convenience and hence do not define the sphere of protection or the scope of the embodiments.

In particular, the solution proposed does not interfere, reducing the performance in terms of speed, with the known solutions illustrated in FIGS. 1, 1a, 1b, 1c, 1d and 2.

Parts that are the same as one another in the various devices for measuring current in inductive loads illustrated in the various figures are designated by the same references.

Consequently, the similar blocks already described with reference to the figures regarding the solutions of prior art will not be described again.

Figure 2:
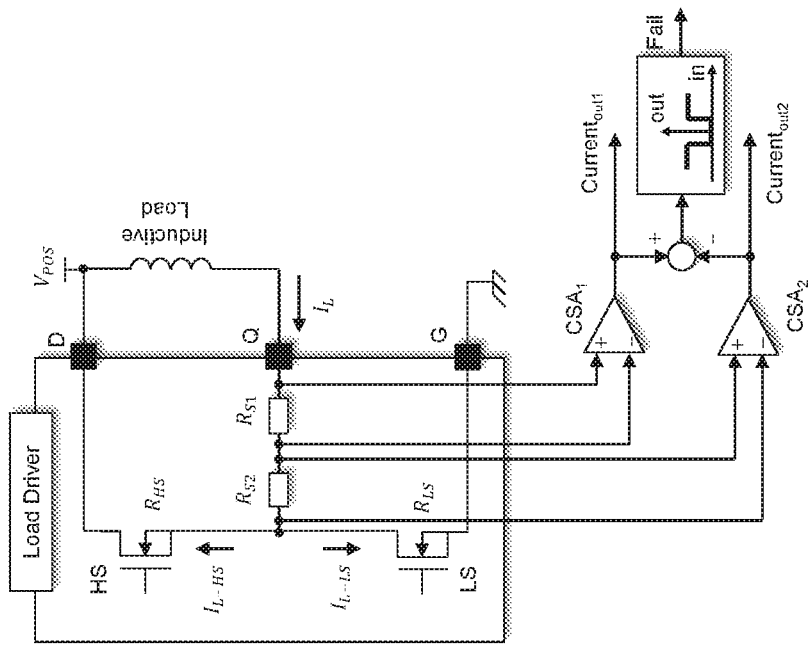
FIGS. 1, 1a, 1b, 1c, 1d, and 2, regarding solutions belonging to the prior art, have already been described.
Figure 1:
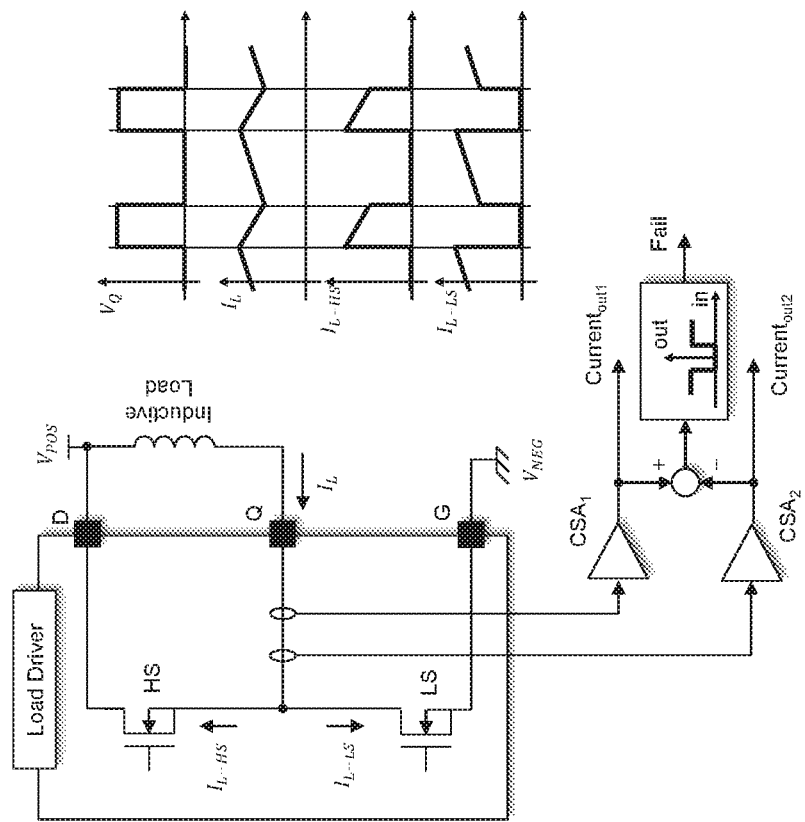
Figure 1B:
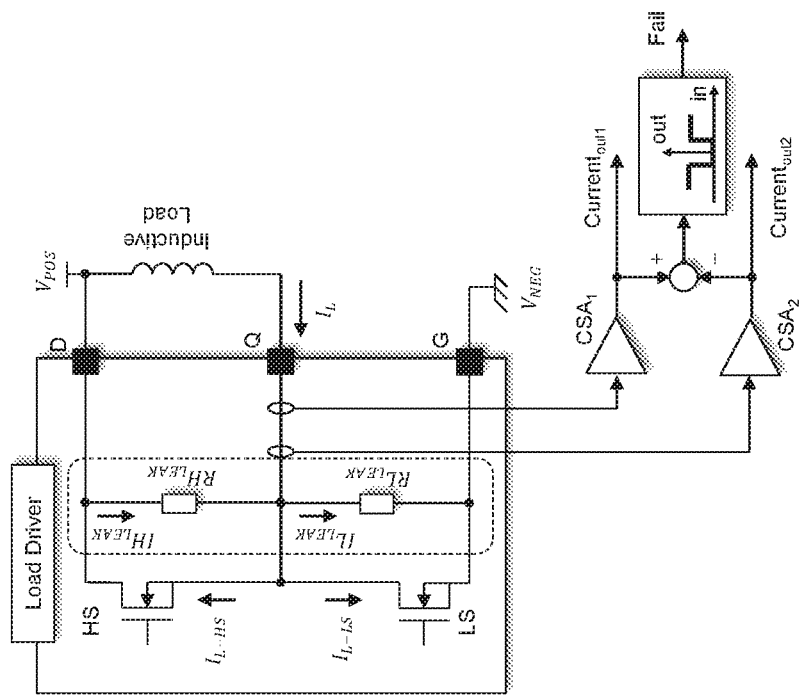
Figure 1A:
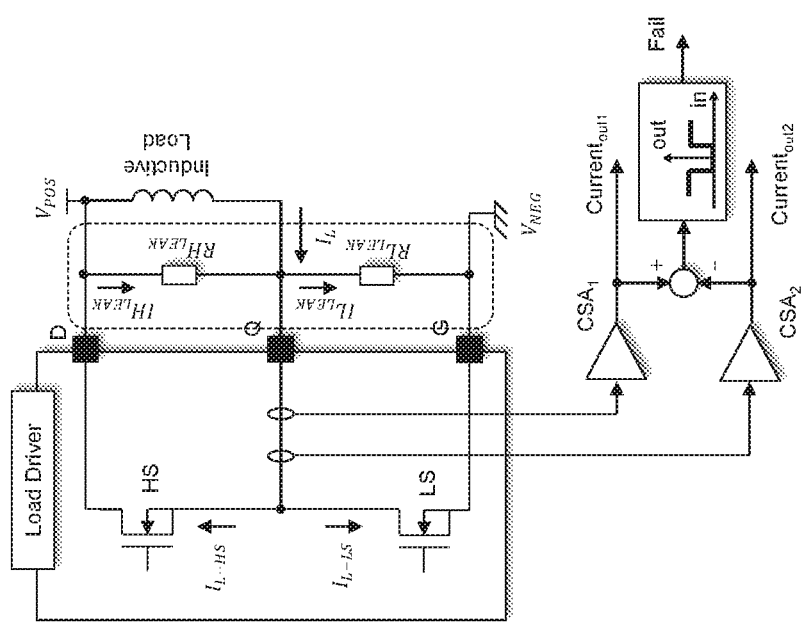
Figure 1D:
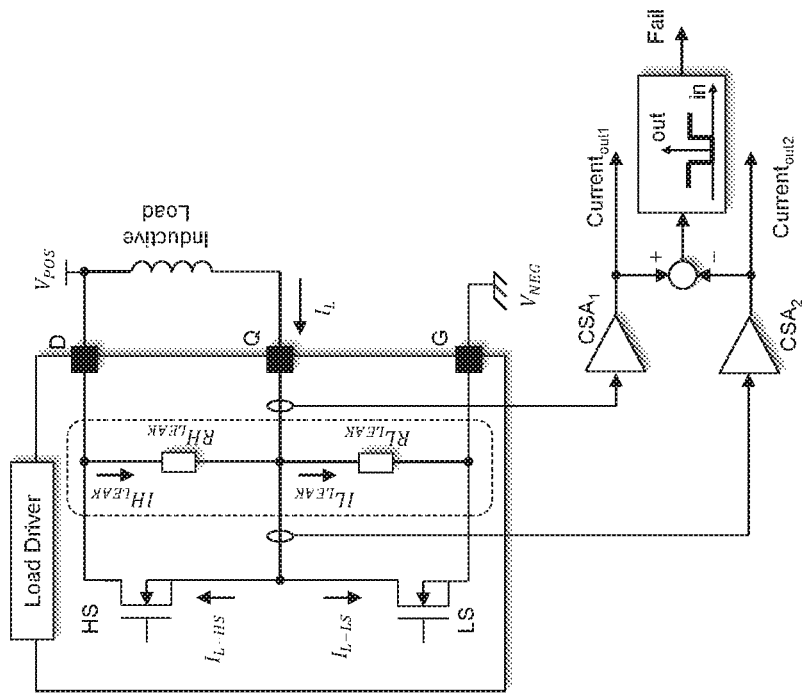
Figure 1C:
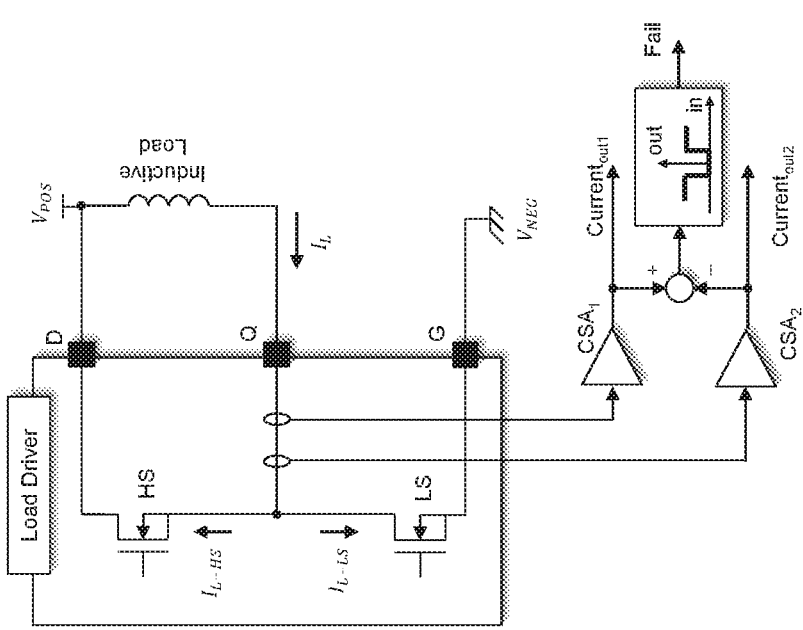
Figure 3:
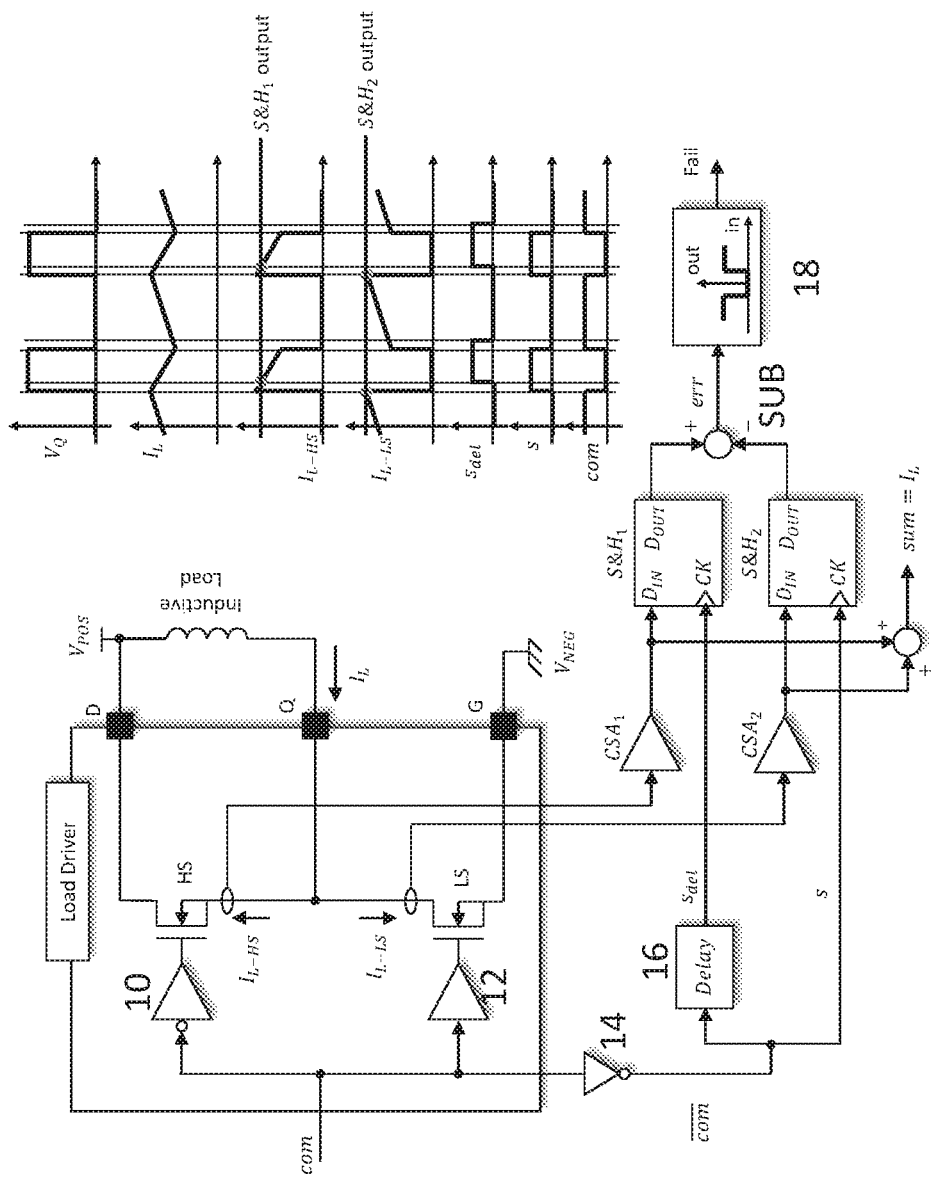
FIGS. 3-12 are examples of various embodiments of a device for measuring the current that flows in an inductive load.

With reference to FIG. 3, an embodiment of the solution described herein measures the current of the inductive load Inductive Load separately on the path of the high-side MOSFET HS and on the path of the low-side MOSFET LS.

Various embodiments of the solutions proposed exploit the principle of the inductive current that does not change significantly at the moment when there is switching from the transistor HS to the transistor LS, and vice versa.

The comparison between the two currents is not continuous in time as in the known solution, but is made between the current of the low-side MOSFET LS an instant before this turns off and the current of the high-side MOSFET HS an instant after this has turned on. In this case, in the embodiments described herein, the comparison is made between the two currents at the maximum peak where there is passage from conduction of the transistor LS to conduction of the transistor HS.

In particular, in the embodiment illustrated in FIG. 3, two different current-measuring paths detect the current $I_L$ of the load that flows in the transistor HS and in the transistor LS.

In particular, the device for measuring the current is driven at input by a control signal com. In greater detail, the gate terminal of the high-side MOSFET HS receives the control signal com inverted by the inverter 10, while the gate terminal of the low-side MOSFET LS receives the control signal com in a direct way via the stage 12.

The current $I_L$ in the inductive load is reconstructed by adding, in an adder SUM, the contributions of the two high-side and low-side sections, in particular by adding the outputs of the current-sense amplifiers (CSAs).

The maximum current peak is sampled and held (S&H) separately on the path of the high-side transistor HS and on the path of the high-side transistor LS, respectively, via the two sample-and-hold blocks $S\&H_1$ and $S\&H_2$.

For instance, in various embodiments, the sample-and-hold blocks S&H can be obtained with very simple sequential electronic circuits, such as flip-flops. In particular, the signal present on the input terminal $D_{IN}$ at the next enable signal supplied at input on the clock terminal CK passes at output as signal $D_{OUT}$.

Furthermore, the control signal com inverted by the inverter stage 14, denoted as $\overline{\text{com}}$, is used as activation signal (or clock signal) for enabling the sample-and-hold blocks S&H$_1$ and S&H$_2$.

In particular, the inverted signal $\overline{\text{com}}$ is brought at input as signal S directly on the clock input of the block S&H$_2$, whereas it is first delayed by a delay block 16 and then sent at input as signal S$_{del}$ on the clock input of the block S&H$_1$.

A subtractor node SUB generates the error signal err as the difference of the outputs of the two sample-and-hold blocks S&H$_1$ and S&H$_2$.

A window comparator 18 generates a failure signal Fail in the case where the error signal err falls outside a predefined window. Hence, the resulting failure signal Fail indicates the case where the maximum peaks of the currents in the transistors HS and LS differ by a predefined value.

The waveforms appearing in FIG. 3 represent, respectively, the voltage V$_Q$ on the node Q, the current I$_L$ on the inductive load, the currents I$_{L\text{-}HS}$ and I$_{L\text{-}LS}$ in the two respective separate measurement paths (and the output signals of the sample-and-hold blocks S&H$_{1output}$ and S&H$_{2output}$), the delayed clock signal S$_{del}$, the clock signal S, and the control signal com. In this case, the waveforms reproduced show that the outputs S&H$_{1output}$ and S&H$_{2output}$ of the sample-and-hold blocks S&H$_1$ and S&H$_2$ are at a level that corresponds to the maximum peak, where there is the passage from conduction of the transistor LS to conduction of the transistor HS.

Figure 6:
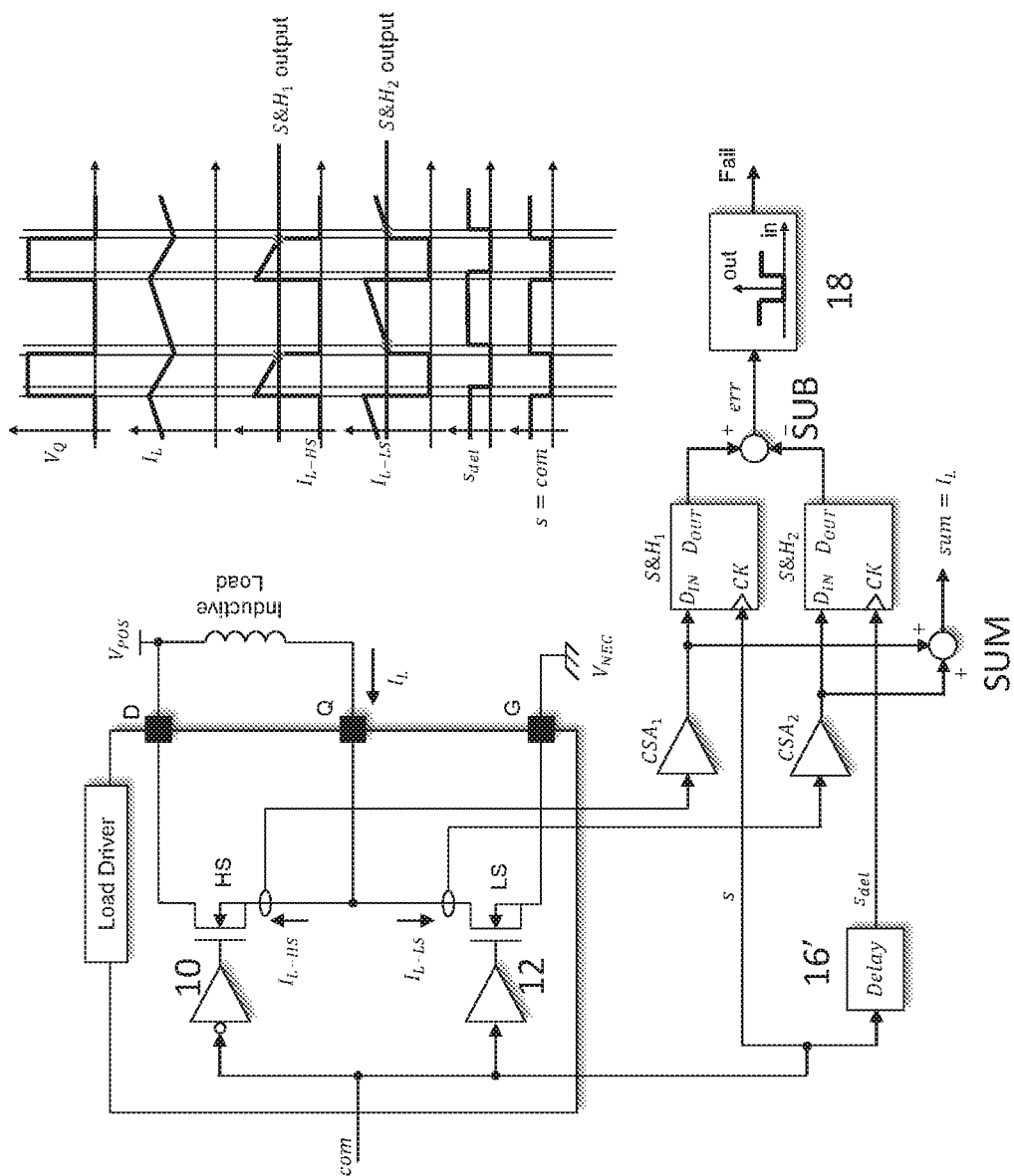

In various embodiments, the comparison can also be made between the current that flows in the transistor HS an instant before this turns off and the current that flows in the transistor LS an instant after this has turned on (see, for example, FIG. 6).

With reference to FIG. 6, in this case the comparison is made between the two currents at the minimum peak, where there is passage from conduction of the transistor HS to conduction of the transistor LS.

In this embodiment (FIG. 6), unlike the embodiment of FIG. 3, the control signal com is used as activation signal (or clock signal) for enabling the sample-and-hold blocks S&H$_1$ and S&H$_2$. Furthermore, in this case the inverter stage 14 is not necessary.

In particular, the delay block 16 is replaced by a delay block 16' set on the low-side path, for generating a signal S$_{del}$, which is sent at input as clock signal of the block S&H$_2$.

In this case, the waveforms reproduced show that the outputs S&H$_{1output}$ and S&H$_{2output}$ of the sample-and-hold blocks S&H$_1$ and S&H$_2$ are at a level that corresponds to the minimum peak, where there is passage from conduction of the transistor HS to conduction of the transistor LS.

Figure 7:
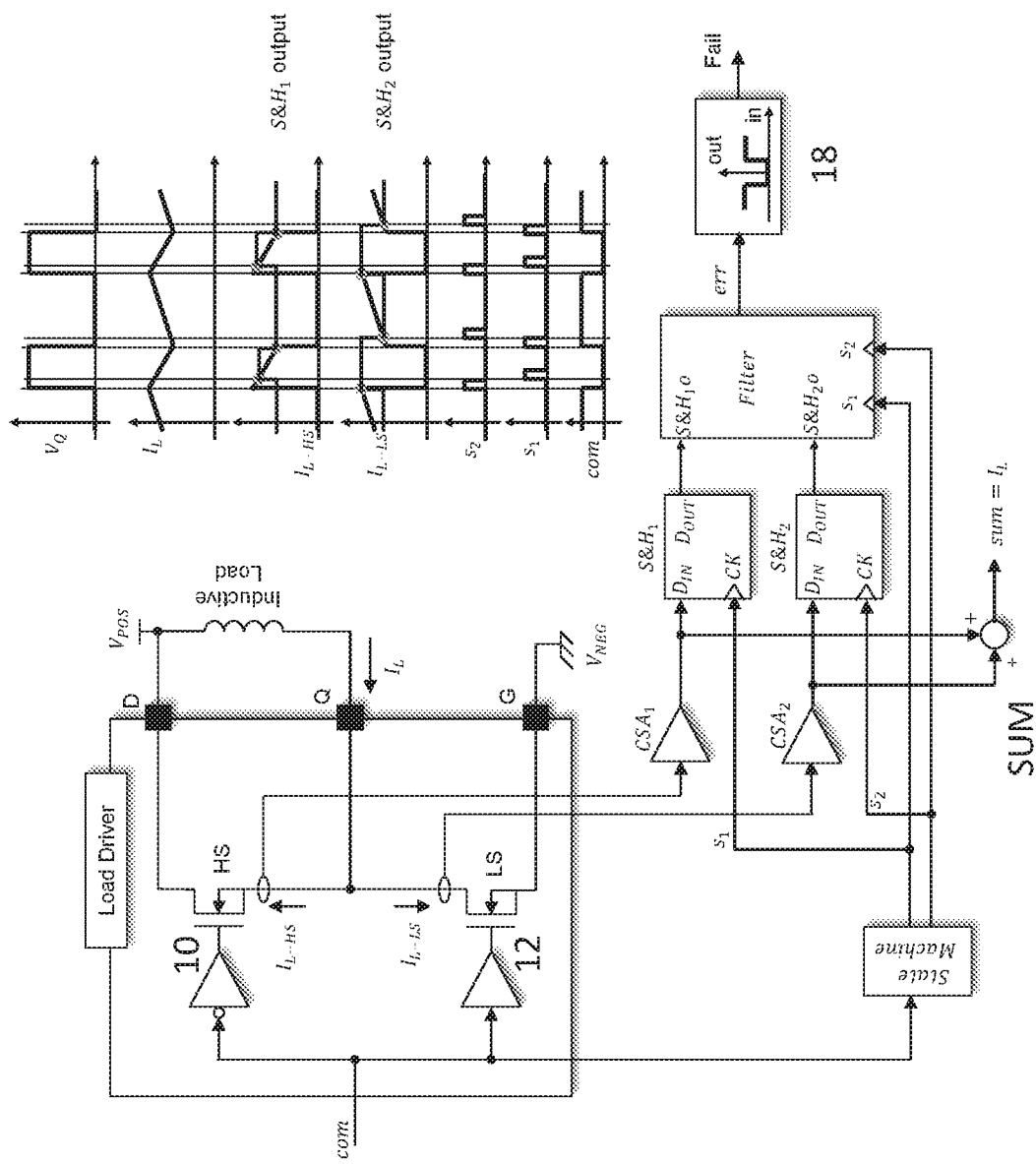

In various embodiments, it may be envisaged that the checks are made on both of the peaks, as illustrated in FIGS. 7 and 8.

Illustrated in FIGS. 7 and 8 is a possible variant of the embodiments, which represents a combination of the principles proposed in the embodiments of FIGS. 3 and 6. In particular, in this case both of the maximum and minimum current peaks are sampled and held (S&H) on the two transistors HS and LS separately with the two blocks S&H$_1$ and S&H$_2$, respectively. The filtering block combines and averages the values of the minimum and maximum peaks of the two transistors HS, LS in such a way as to:
separate the signal from the noise; and
accept or reject various types of failure.
In FIG. 7 a finite-state machine is present, which generates the signals s$_1$ and s$_2$ that are required for driving the filter. The filter receives at input the two values S&H$_{1output}$ and S&H$_{2output}$ at output from the sample-and-hold blocks S&H$_1$ and S&H$_2$ and generates the value err at output.

Figure 8B:
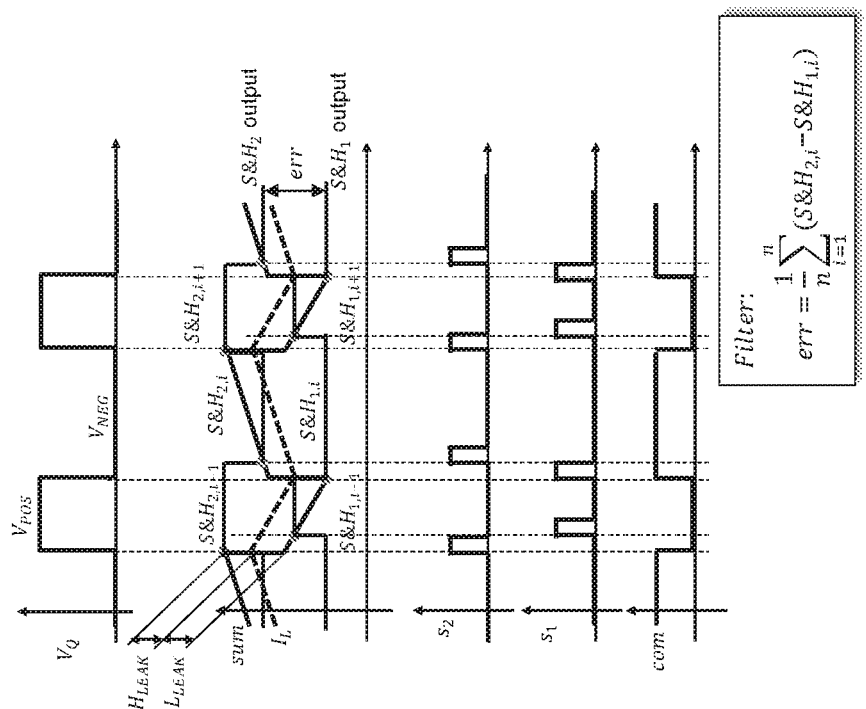
Figure 8A:
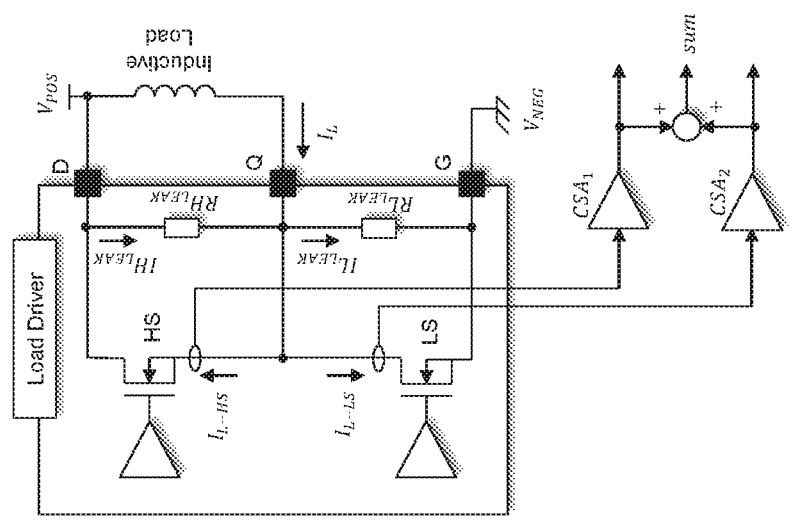

In particular, FIG. 8a shows the detection of the failures.

Detection of the failures due to the leakage resistances RH$_{LEAK}$ and RL$_{LEAK}$ is guaranteed irrespective of whether they are inside or outside the load driver device Load Driver. In particular, in FIG. 8a, which exemplifies an embodiment, the two leakage resistances RH$_{LEAK}$ and RL$_{LEAK}$ are within the load driver device Load Driver.

Also indicated are the two leakage currents that flow in the two resistors RH$_{LEAK}$ and RL$_{LEAK}$, which can be calculated as:

$$IH_{LEAK} = \frac{V_{POS} - V_{NEG}}{RH_{LEAK}}$$

$$IL_{LEAK} = \frac{V_{POS} - V_{NEG}}{RL_{LEAK}}$$

FIG. 8b shows the waveforms in the case of a classic filter with the following characteristic:

$$\text{err} = \frac{1}{n}\sum_{i=1}^{n}(S\&H_{2,i} - S\&H_{1,i})$$

In particular, the filtering block:
subtracts corresponding samples S&H$_{j,i}$ with j=1,2; in this way, it detects the failures of the leakage or dispersion currents IH$_{LEAK}$ and IL$_{LEAK}$; it also detects, with the same principle, errors in the gain chain of the two current-sense amplifiers CSA$_1$ and CSA$_2$; and
averages the "n" samples; in this way it reduces the noise of the individual samples.

The criterion of acceptance is that the difference of the measurements should be lower than a pre-set maximum error; instead, if the error is higher than a maximum value, it is not accepted. Consequently, in all the figures representing the solutions described herein, a window comparator always appears.

Figure 4:
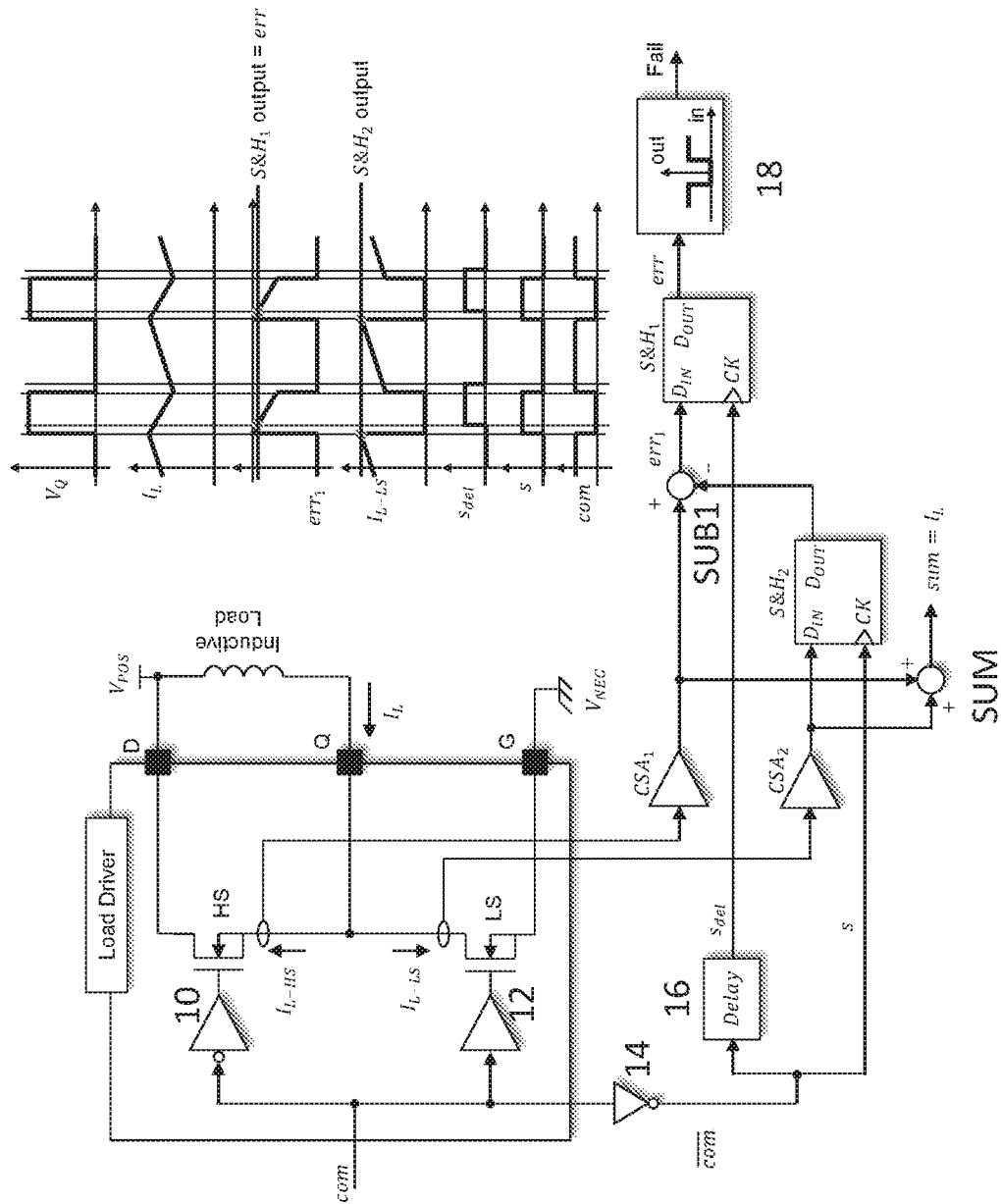

With reference to FIG. 4, the first of the two samplings is made on the transistor LS before it turns off, as in FIG. 3. Instead, the second sampling is made after calculation of the difference between the sample of the transistor HS just turned on and the previously stored sample of the transistor LS.

In particular, a subtractor node SUB1 calculates the value err1 as difference between the value of the current that flows in the transistor HS and the value of the current that was flowing at the previous instant in the transistor LS and was previously stored in the block S&H$_2$.

The second sampler S&H$_1$ in this case must store a difference that is normally close to zero and in any case must exceed the pre-set maximum error only slightly. Consequently, in this case, the second sampler S&H$_1$ receives at input the value err1, samples it, stores it, and makes it available at output at the next clock signal. Consequently, the signal at output from the second sampler S&H$_1$ represents the error err.

The second sampler S&H$_1$ presents the advantage of greater simplicity in so far as it requires a lower accuracy, because the difference is calculated before, and a smaller storage capacity, because the difference signal has a lower value.

Figure 5:
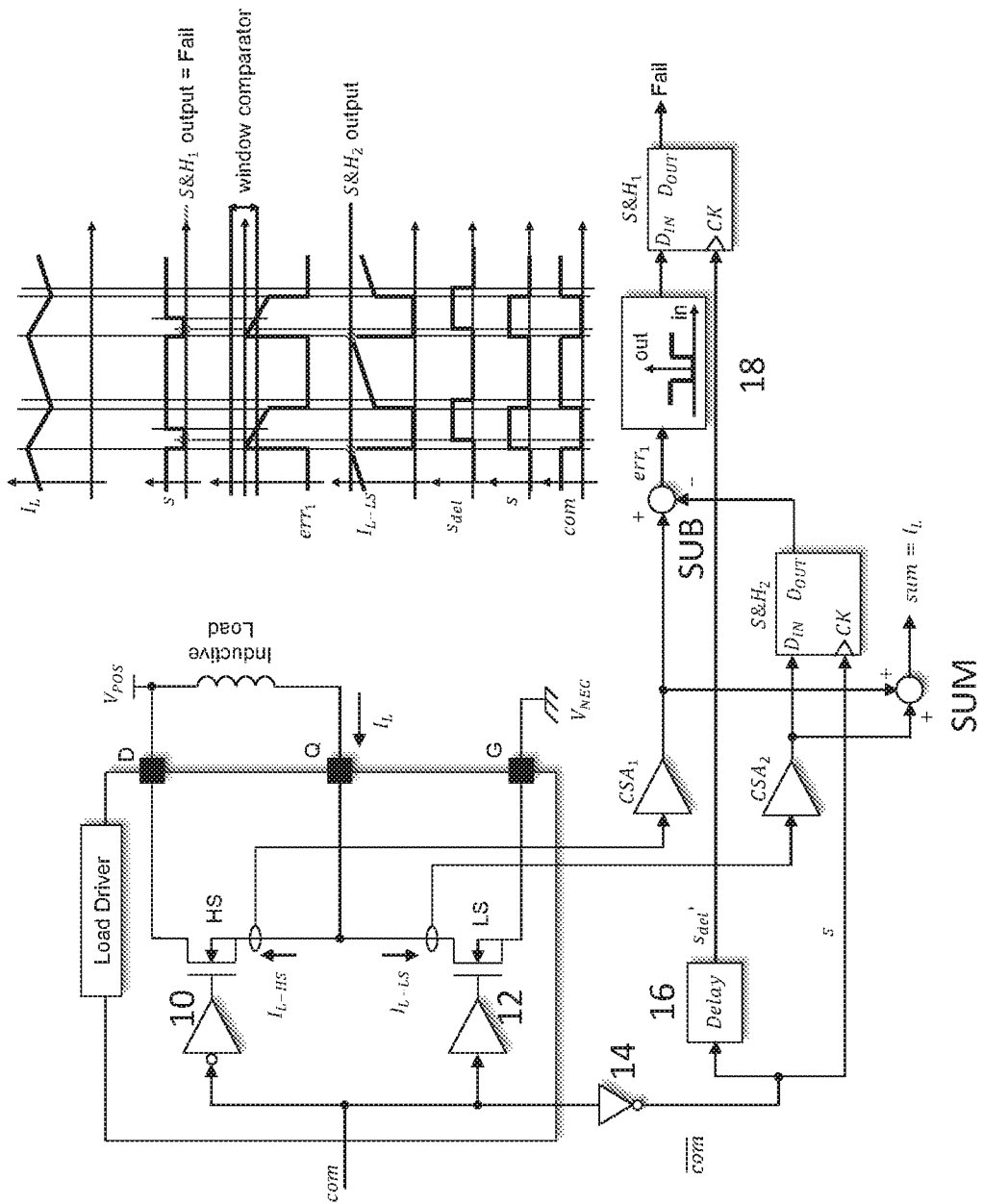

With reference to FIG. 5, the second sampler $S\&H_1$ is shifted even further downstream with respect to the solution of FIG. 4, in particular after the window comparator. The final result (signal Fail) remains unaltered after this modification. The advantage for the second sampler $S\&H_2$ is even more marked since it becomes a flip-flop in so far as it has to store just one logic information bit (low level "0" or high level "1").

Consequently, the embodiment illustrated in FIG. 5 follows the same principle as the solution illustrated in FIG. 4, where the second sampler $S\&H_1$ has been shifted after the window comparator.

The advantage of this embodiment is represented by the fact that the second sampler $S\&H_1$ has a minimal complexity since it processes a single-bit digital signal.

With reference to FIG. 6, the comparison of currents may also be made between that of the transistor HS an instant before this turns off and that of the transistor LS an instant after this has turned on. In this case, the comparison is made between the two currents at the minimum peak where there is passage from conduction of the transistor HS to conduction of the transistor LS.

The passages described in FIGS. 4 and 5 also apply to the embodiment of FIG. 6.

In particular, the same principle as that of the embodiment of FIG. 3 applies, where the minimum peak current is sampled and held (S&H) on the two, high-side and low-side, portions separately by the two blocks $S\&H_1$ and $S\&H_2$, respectively.

As already said, the operating principle of this embodiment also applies to the solutions proposed in FIGS. 4 and 5.

Figure 9:
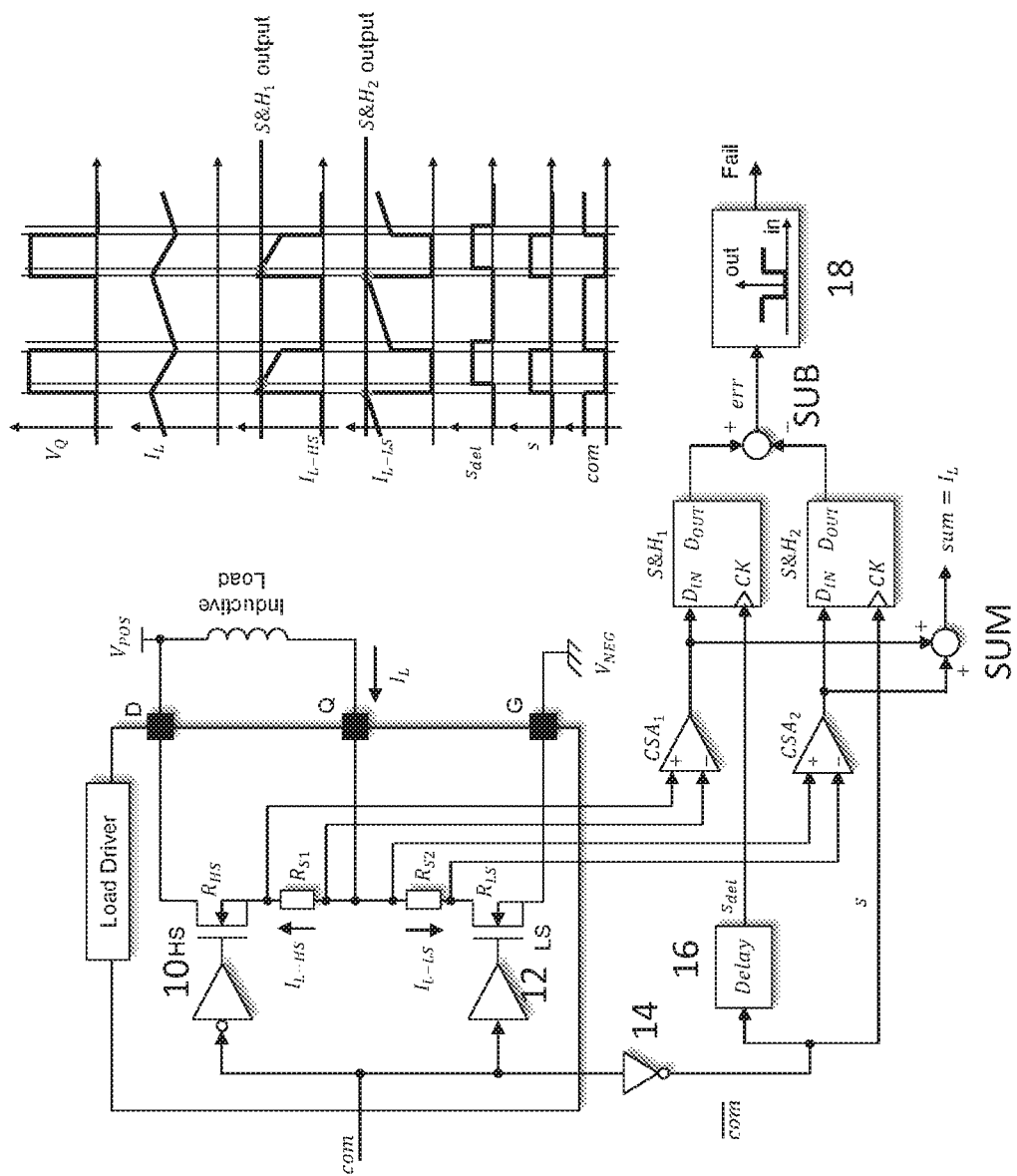

FIG. 9 shows a further alternative embodiment.

In the solutions proposed according to FIGS. 3 to 8, the measurement of current can be made via two series resistances, which, however, are activated just one at a time. Consequently, there is a minimal impact on the series resistance of the total impedance seen between the pins of the integrated device. In particular, the path from the node D to the node Q is made up of $R_{S1}$ and $R_{HS}$. Furthermore, the path from the node Q to the node G is made up of $R_{S2}$ and $R_{LS}$.

The solution proposed consequently adds just one series resistance on each of the two paths. Consequently, the power transistors do not require any oversizing with respect to the case of current measurement in the absence of redundancy for functional safety.

Figure 10:
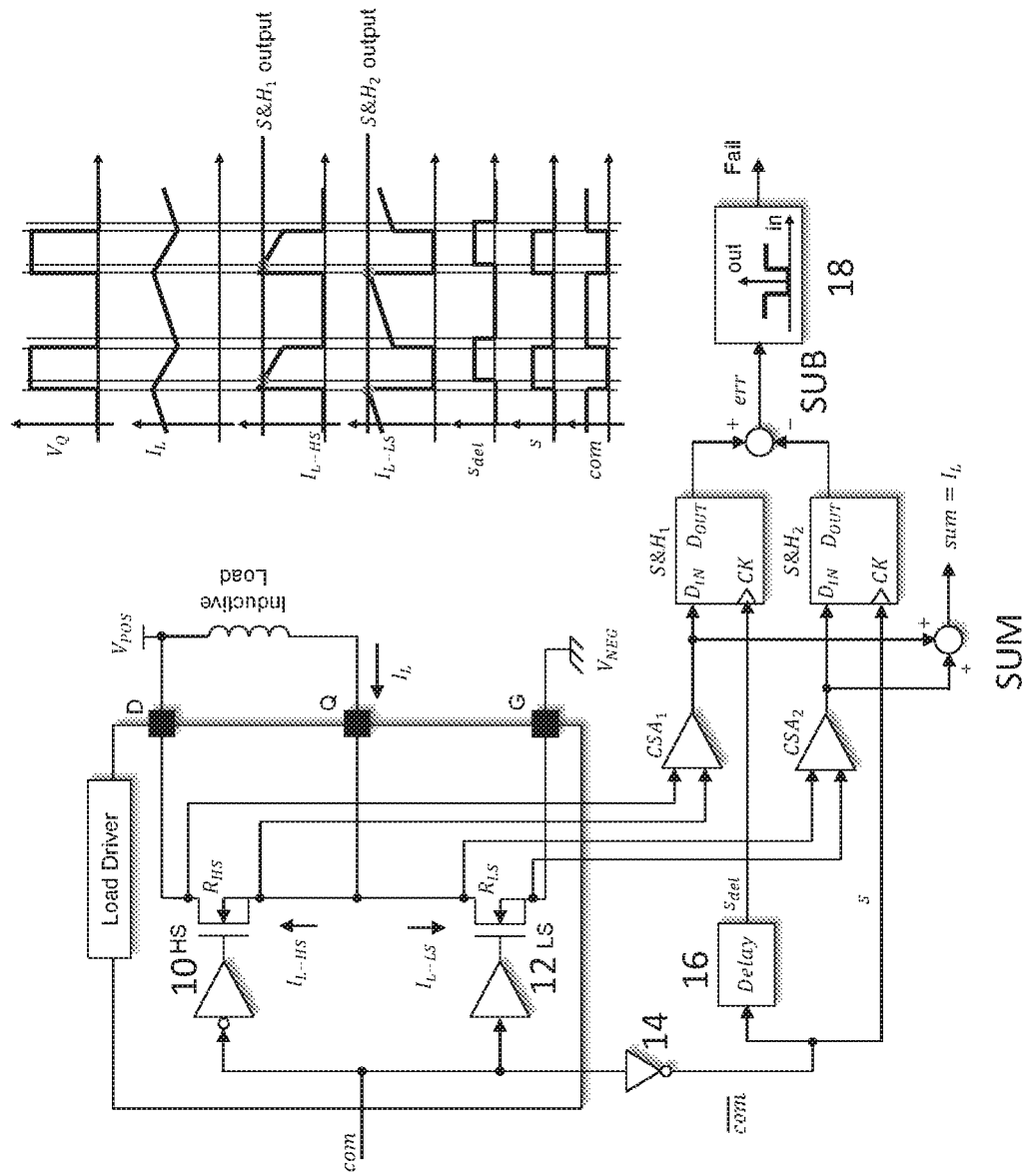

FIG. 10 shows a further alternative embodiment.

In particular, in this embodiment, the current is sampled on the drain and on the source of the two transistors HS and LS.

This embodiment adopts a known practice alternative to the measurement of current according to FIG. 9, i.e., that of using the power MOS transistor (HS and LS), which, when it is turned on, has an impedance equivalent to that of a resistance ($R_{HS}$ and $R_{LS}$, respectively). With this solution, the measurement of current has a zero impact on the series resistance of the total impedance seen between the pins of the integrated device. Consequently, the path from the node D to the node Q is only constituted by $R_{HS}$. Instead, the path from the node Q to the node G is only constituted by $R_{LS}$.

With respect to the embodiment proposed in FIG. 9, the current-detection resistances $R_{S1}$ and $R_{S2}$ are obtained with the resistances $R_{HS}$ and $R_{LS}$, respectively, of the power MOS transistors. In this way, the total impedances on the paths HS and LS are due just to the ON-resistance of the power MOS transistors themselves, and consequently the size of the circuit area is minimized.

In the embodiments proposed according to FIGS. 3 to 9, the measurement of current may be made via the power MOS transistor (HS and LS), as in the case of the known solution, without any drawbacks.

In all the solutions proposed up to FIG. 10, an analog-to-digital converter is introduced on both of the outputs of the CSA, and consequently all the subsequent functions are implemented in digital technology.

Figure 11:
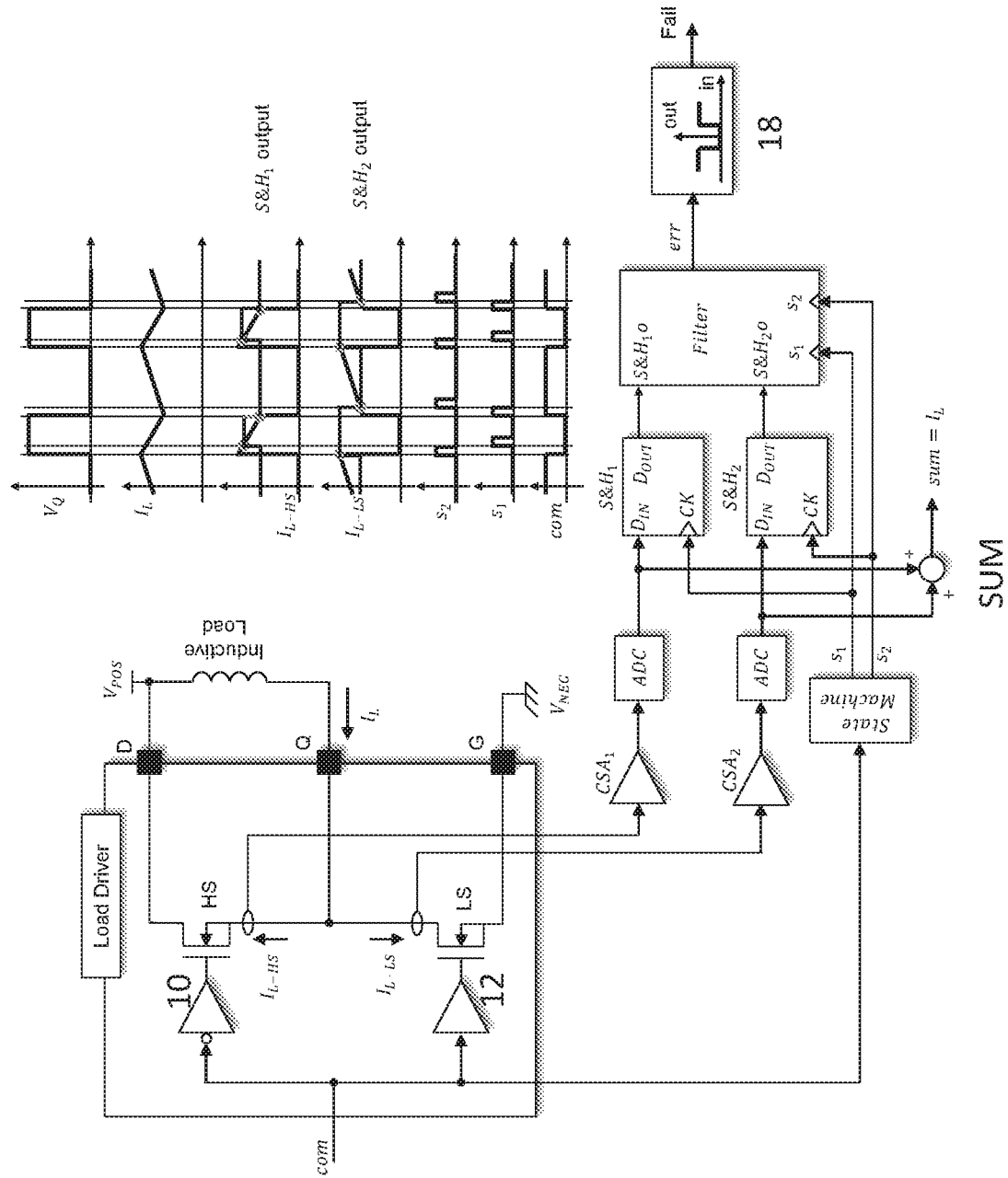

FIG. 11 shows by way of example the digital evolution of the embodiment of FIG. 7.

In particular, in FIG. 11 the analog-to-digital converters (ADCs) have been introduced.

All the solutions proposed describe a load with one side connected to the positive supply; however, the same solutions apply also in the case of a load with one side connected to the negative supply, or else with both sides of the load driven.

Some types of inductive load, such as the solenoids of automotive braking systems, show a current that varies fast after switching of the driver.

All the solutions proposed up to FIG. 11 would calculate an error $err_0$ even in the case of normal operation in the absence of failures. This error would be rather high with respect to what there would be in the case of failure. It is consequently necessary to erase this error prior to sending the result to the input of the window comparator.

In general, this error $err_0$ depends upon the characteristics of the inductive load and the operating conditions to which it is subjected (supply voltage, average operating currents, temperature, etc.).

Figure 12:
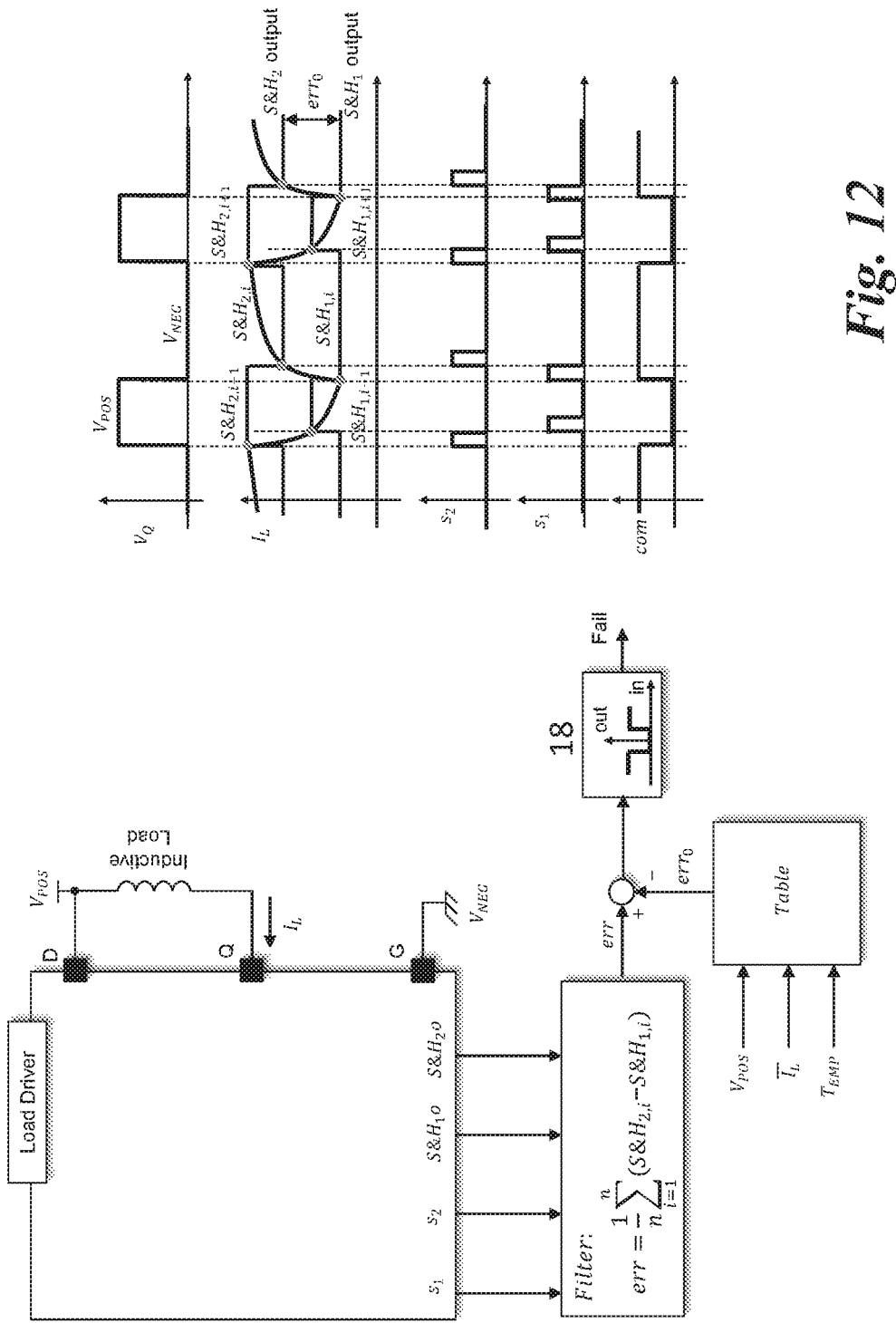

The solution proposed in FIG. 12 is a table that estimates the value of $err_0$ on the basis of the operating conditions mentioned above and a subtractor that subtracts it from the measurement obtained with any of the embodiments proposed up to FIG. 11.

FIG. 12 reproduces a case of inductive load with fast time constant.

In this case, the waveform of the load current is a steep exponential rather than triangular, as in the previous figures. All the embodiments proposed for this case show a high value of $err_0$ also in the case of normal operation.

In this case, the solution proposed is an additional block that subtracts the above value of $err_0$ upstream of the window comparator that makes the decision as to whether there is a failure or not. This value is stored within a table that takes into account all the independent variables that affect the value itself, such as: the supply voltage of the driver load; the average current in the load; and the temperature of the load.

Without prejudice to the underlying principles, the details and the embodiments may vary, even appreciably, with respect to what has been described purely by way of example, without thereby departing from the sphere of protection, as this is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
   a switching circuit including a first switch and a second switch, the first switch having a first terminal coupled to a first node and a second terminal coupled to a second node, the second switch having a first terminal coupled to the second node and a second terminal coupled to a third node;
   a current sensing circuit coupled to the switching circuit, the current sensing circuit including:
      a first current-sense amplifier configured to sense a first current through the first switch at a first location between the second terminal of the first switch and the second node, and to generate a first sensed current signal based on the sensed first current, and
      a second current-sense amplifier configured to sense a second current through the second switch at a second location between the first terminal of the second switch and the second node, and to generate a second sensed current signal based on the sensed second current, wherein the second node is disposed between the first location and the second location; and
   an output circuit coupled to the current sensing circuit and configured to generate a failure signal based on the first sensed current signal and the second sensed current signal.

2. The circuit of claim 1, wherein the output circuit is configured to generate the failure signal based on a difference between the first sensed current signal and second sensed current signal.

3. The circuit of claim 2, wherein the output circuit is configured to generate an error signal based on the difference between first sensed current signal and the second sensed current signal, and is further configured to generate the failure signal based on the error signal.

4. The circuit of claim 3, wherein the output circuit comprises window comparator configured to generate the failure signal in response to the error signal, a first threshold value, and a second threshold value.

5. The circuit of claim 4, wherein the output circuit further comprises a first sample and hold circuit and a second sample and hold circuit configured to sample the first current and the second current, respectively.

6. The circuit of claim 1, wherein the first switch and the second switch comprise a first transistor and a second transistor, respectively.

7. The circuit of claim 6, wherein each of the first transistor and the second transistor is an power N-channel MOSFET transistor.

8. The circuit of claim 1, wherein the switching circuit comprises a half-bridge circuit.

9. The circuit of claim 1, wherein:
   the first node is configured to receive a first supply voltage a-configured to be coupled to a first terminal of an inductive load,
   the second node is configured to be coupled to a second terminal of the inductive load, and
   the third node configured to receive a second supply voltage.

10. The circuit of claim 1, wherein the switching circuit comprises the first and second switches coupled in series with first and second measurement resistors.

11. A load driver circuit, comprising:
    a switching circuit including first and second nodes configured to be coupled to an inductive load, a first switch having a first terminal coupled to the first node and a second terminal coupled to the second node, and a second switch having a first terminal coupled to the second node and a second terminal coupled to a third node configured to receive a reference supply voltage;
    a current sensing circuit coupled to the switching circuit, the current sensing circuit including:
       a first current-sense amplifier configured to sense a first current through the first switch at a first location between the second terminal of the first switch and the second node, and
       a second current-sense amplifier configured to sense a second current through the second switch at a second location between the first terminal of the second switch and the second node, wherein the second node is disposed between the first location and the second location; and
    an output circuit coupled to the current sensing circuit and configured to generate a failure signal based on the first and second currents, the failure signal indicating if peak values of the first and second currents differ by a predefined value.

12. The load driver circuit of claim 11, wherein the output circuit is configured to generate the failure signal based on a difference between the sensed first and second currents.

13. The load driver circuit of claim 11, wherein the output circuit is configured to receive a first threshold value and a second threshold value, and is configured to generate the failure signal indicating the peak values differ by the predefined value based on a window defined by the first threshold value and second threshold value.

14. The load driver circuit of claim 13, wherein the output circuit is configured to generate and error signal based on a difference between the sensed first and second currents, and is configured to activate the failure signal in response to the error signal having a value outside the window defined by the first threshold value and second threshold value.

15. The load driver circuit of claim 11, wherein the switching circuit is configured to receive a control signal and the current sensing circuit is configured to receive a clock signal derived from the control signal.

16. A method, comprising:
    sensing, by a first current-sense amplifier, a first current flowing through a first switch at a first location, the first switch having a first terminal coupled to a first node and a second terminal coupled to a second node, the first node further coupled to a first terminal of an inductive load, the first location being between the second terminal of the first switch and the second node;
    sensing, by a second current-sense amplifier, a second current flowing through a second switch at a second location, the second switch having a first terminal coupled to the second node and a second terminal coupled to a third node, the second node further coupled to a second terminal of the inductive load, the second location being between the first terminal of the second switch and the second node;
    generating a current error signal based on a difference between the sensed first current and the sensed second current; and
    generating a failure signal based upon the current error signal.

17. The method of claim 16, wherein generating the failure signal comprises activating the failure signal in response to the current error signal having a value outside a window defined by a first threshold value and a second threshold value.

18. The method of claim 16, wherein sensing the first current comprises closing the second switch.

19. The method of claim 18, wherein sensing the second current comprises closing the first switch.

20. The load driver circuit of claim 11, wherein the switching circuit comprises the first and second switches coupled in series with first and second measurement resistors.

* * * * *

UNITED STATES PATENT AND TRADEMARK OFFICE
CERTIFICATE OF CORRECTION

PATENT NO. : 11,150,279 B2
APPLICATION NO. : 16/554248
DATED : October 19, 2021
INVENTOR(S) : Vanni Poletto et al.

Page 1 of 1

It is certified that error appears in the above-identified patent and that said Letters Patent is hereby corrected as shown below:

In the Claims

Column 9, Claim 7, Line 49:
"is an power" should read: --is a power--.

Column 9, Claim 9, Lines 54-55:
"voltage a-configured" should read: --voltage configured--.

Signed and Sealed this
Twenty-first Day of June, 2022

Katherine Kelly Vidal
*Director of the United States Patent and Trademark Office*